United States Patent [19]

Michaelis

[11] 4,027,298
[45] May 31, 1977

[54] MAGNETIC BUBBLE MEMORY BIAS MAGNET ARRANGEMENT

[75] Inventor: Paul Charles Michaelis, Watchung, N.J.

[73] Assignee: Bell Telephone Laboratories, Incorporated, Murray Hill, N.J.

[22] Filed: Nov. 5, 1975

[21] Appl. No.: 629,006

[52] U.S. Cl. .................. 340/174 TF; 340/174 BC
[51] Int. Cl.² .................................... G11C 11/14
[58] Field of Search ............. 340/174 TF, 174 BC, 340/174 PM; 335/306

[56] References Cited
UNITED STATES PATENTS

| | | | |
|---|---|---|---|
| 3,744,042 | 7/1973 | Cutler et al. | 340/174 TF |
| 3,927,397 | 12/1975 | Chow | 340/174 TF |
| 3,931,618 | 1/1976 | Lacey | 340/174 TF |

*Primary Examiner*—James W. Moffitt
*Attorney, Agent, or Firm*—Herbert M. Shapiro

[57] ABSTRACT

An in-plane magnetic holding field, long known to provide improved operating margins for a magnetic bubble memory during stop-start operation, is produced by a unique bias magnet design which provides a constant in-plane bias field in a manner consistent with normal bubble propagation as well as with stop-start operation.

8 Claims, 2 Drawing Figures

MAGNETIC BUBBLE MEMORY BIAS MAGNET ARRANGEMENT

FIELD OF THE INVENTION

This invention relates to magnetic bubble memories and more particularly to permanent magnetic biasing arrangements for such memories.

BACKGROUND OF THE INVENTION

Magnetic bubble memories are known to operate in a familiar field-access mode. Memories of this type are characterized by a pattern of magnetic elements, typically of magnetically soft permalloy, which responds to a magnetic field rotating in a plane of bubble movement to generate a pattern of localized magnetic field gradients. A magnetic bias field, antiparallel to the magnetization of a bubble and normal to the plane of bubble movement, is present to provide a range of stability over which a bubble memory is operable.

A highly attractive feature of a bubble memory is its nonvolatility. That is to say that a bubble pattern representative of information remains undisturbed in the absence of a drive field. Thus, power to a bubble memory may be interrupted without the loss of information Yet information may be disturbed in a bubble memory during the transients which occur when the drive field stops and starts. For example, a bubble pattern may occupy a particular set of positions with respect to the permalloy pattern when the drive field stops and the field may later start in an orientation consistent with the occupation of different positions. Ambiguous movement of information results. Consequently, it has been found to be helpful if a power interruption occurs, for the drive circuitry to be adapted to ensure movement of information to closest safe positions and that the drive field next be activated in an orientation consistent with the occupation of those positions.

It has long been known that an in-plane (holding) field improves the stability of bubble patterns during stop-start operation. Such a field is oriented in a direction, in the plane of bubble movement, consistent with the occupation of safe positions by a bubble pattern. The result is improved operating margins and yield in the manufacture of bubble packages.

Because the presence of the holding field has been generally thought to be helpful only during stop-start operation, its presence during normal operation was considered of little if any positive value. Because that presence causes a variation in the drive field amplitude, its elimination during operation has been thought desirable. Thus, U.S. Pat. No. 3,744,042 issued July 3, 1973 discloses the canting of the magnetic bias field-generating means with respect to the plane of bubble movement in order to provide a holding field. But the patent also shows a circuit powered by the drive field power supply which provides a field equal and antiparallel to the holding field. During normal operation, the net result is that these two fields ideally cancel. Yet when drive power terminates, so does the antiparallel field leaving the holding field to ensure bubble stability.

The canting of the bias magnet with respect to the plane of bubble movement requires considerable attention for each device so arranged. For example, a bias field for a bubble device is supplied, typically, by a Watson magnet. Such a magnet comprises four elements abutting one another to form a rectangular arrangement. One pair of parallel elements comprises permanent magnets typically high coercive force INDOX. The remaining pair of elements comprises keepers of magnetically soft material such as ferrite. The magnetization of each INDOX element is saturated parallel to the faces of the element, the overall arrangement being adapted to supply a uniform field parallel to the INDOX elements within the cavity formed by the rectangular array. The plan of bubble movement is placed in that cavity and the canting of the magnet requires increased volume within the overall package and a tailored angle depending on the individual chip characteristics. The procedure is difficult to adapt to mass production.

For bubble memories in which a number of chips are organized in a single plane for encapsulation, the (Watson magnet) package becomes increasingly bulky and the difficulty in providing a uniform magnetic field increases. An alternative to the Watson magnet would be particularly attractive for producing less bulky packages if a uniform bias field still could be supplied.

BRIEF DESCRIPTION OF THE INVENTION

The present invention is directed at a "flat-pack" magnetic bias arrangement, particularly for multiple chip bubble packages, which incorporates a high permeability can into its structure. The can is necessary, in any case, to isolate a bubble memory magnetically from its environment. Consequently, the use of the can as an integral part of the magnet structure does not constitute an additional cost element.

In a preferred embodiment, the arrangement comprises two spaced apart high coercive force members each with a magnetically soft ferrite layer adjacent to the high coercive force layer. A plane, to which a number of bubble chips is attached, is supported between the two members with the soft ferrite layers facing inwardly. The INDOX members are enclosed by a high permeability (permalloy) can which functions as a flux closure path for the INDOX members. The INDOX members are of high coercive force material magnetized in a direction normal to the plane of the chips, the entire structure being adapted to maintain a uniform bias field over a relatively large area of the plane.

In practice, in accordance with a preferred embodiment of this invention, each soft ferrite layer is formed in a wedge shape to provide a constant field in the plane of the chips. By proper alignment of this field to compensate for the characteristic offset in the nominally circular in-plane drive field and by the selection of safe positions to be consistent with this alignment, the constant in-plane field so provided is advantageous during normal operation as well as during stop-start operation.

DETAILED DESCRIPTION

Figure 1:
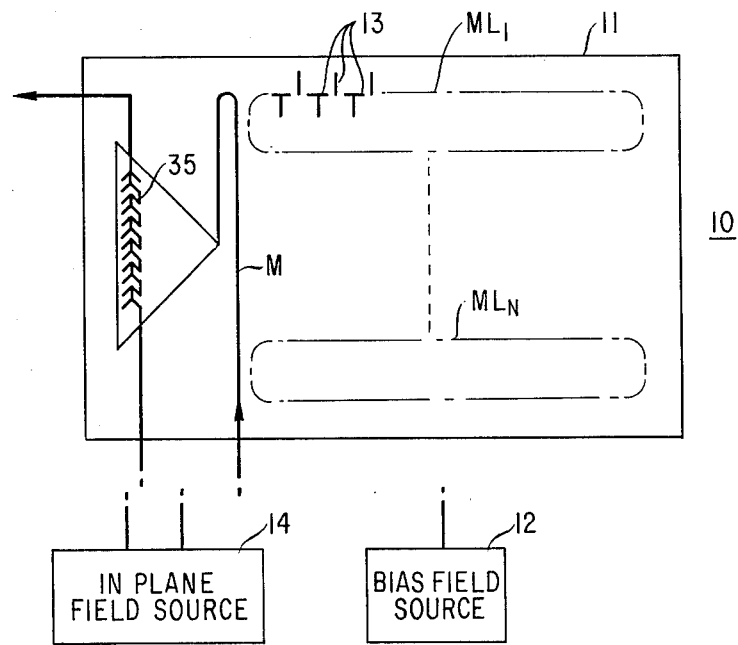
FIG. 1 is a schematic representation of a portion of a prior art magnetic bubble memory.

FIG. 1 shows a magnetic bubble memory 10 comprising a layer of material 11 in which magnetic bubbles can be moved in the presence of a magnetic bias field. In practice, layer 11 comprises an epitaxially grown garnet film having an uniaxial anisotropy along an axis normal to the plane of the film. The layer also may comprise an amorphous film as is well known. A bubble is characterized by a magnetization in a first direction along that axis with a south pole assumed directed towards the viewer in FIG. 1. The bias field is antiparallel to the direction of magnetization of the bubble. The source of the bias magnet field is represented by clock 12 in FIG. 1 and is shown in detail in FIG. 2 in accordance with a preferred embodiment of this invention.

A pattern of elements, shown as T and bar shaped elements 13 in FIG. 1, define paths $ML_1 \ldots ML_N$ and M and are organized in a familiar major-minor mode. These elements respond to a magnetic drive field, reorienting typically by rotation in the plane of layer 11, to generate pole patterns which modify the bias field locally to cause localized field gradients to move bubble patterns in the layer. A suitable source of such a rotating in-plane field is represented by block 14 in FIG. 1.

Figure 2:
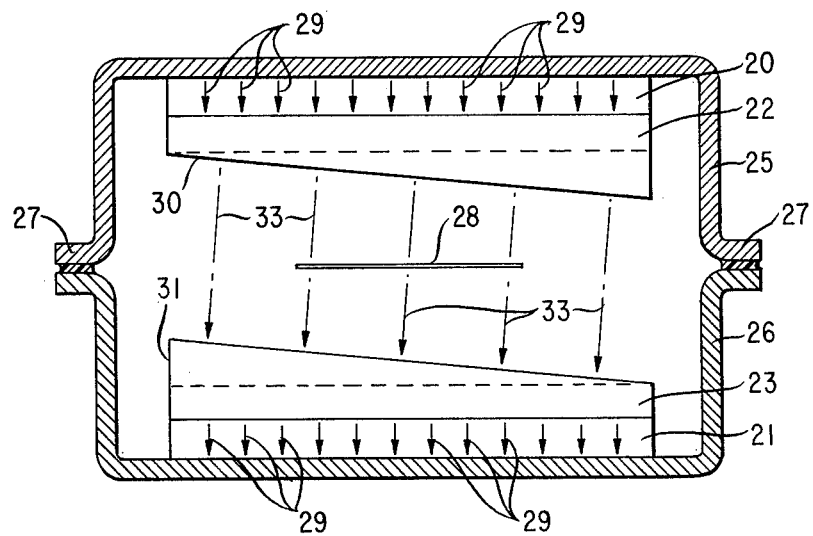
FIG. 2 is a cross sectional representation of a bias magnet arrangement in accordance with an embodiment of this invention for the memory of FIG. 1.

FIG. 2 shows a cross sectional view of a bias magnet arrangement for the memory of FIG. 1. The arrangement comprises first and second members 20 and 21 of a high coercive force material such as INDOX. Adjacent each of members 20 and 21 is a member of magnetically soft material such as ferrite, for example. The ferrite member preferably is dimensionally stable and secured to the INDOX layer, in each instance, with adhesive to form a composite structure. The ferrite members are designated 22 and 23 in the figure.

The composite structures are secured within a magnetically soft can formed conveniently in two parts designated 25 and 26 in FIG. 2. The two parts are joined typically by adhesive at flange 27 during a step in which the entire structure is potted. The can is wider than the composite to reduce fringing fields as is discussed further hereinafter.

Horizontal line 28 designates the plane in which several, each like layer 11 of FIG. 1, bubble chips are mounted much as shown in copending application Ser. No. 552,267, filed Feb. 24, 1975, now U.S. Pat. No. 3,996,574 for A. H. Bobeck, B. H. McGahey, W. M. Melbert, Jr., T. B. Prince, and M. J. Stevenson (Case 109-3-1-14-1). For providing a uniform bias field for the chips in such a plane, members 20 and 21 are magnetized in a direction normal to the plane as indicated by arrows 29.

In order to provide a bias field normal to the face of the magnet, it is required that the ferrite (keepers) members 22 and 23 have uniform thicknesses as indicated by dotted lines 30 and 31. But FIG. 2 shows members 22 and 23 as having nonuniform thicknesses in accordance with this embodiment. The result is a field normal to the face of the keepers as indicated by broken arrows 33. Consequently the bias field arrangement is at an angle to plane 28 and thus provides a constant in-plane dc magnetic field as well as a bias field.

In the preferred embodiment of this invention, this in-plane dc field is oriented with respect to the T and bar shaped elements to ensure movement of bubbles to safe positions in case of power failures and to reduce variations in rotating in-plane field intensities during normal bubble propagation operation. The in-plane field is aligned along the axis of the minor loops (parallel to the tops of the T-shaped elements) in FIG. 1. The reason for this alignment is to compensate for the characteristic offset in the center of the nominally circular bubble drive (rotating) field.

The rotating field is generated typically by X and Y tuned circuits driven 90° out of phase with one another. In practice, the circuits are refreshed each cycle as is disclosed in copending patent application Ser. No. 591,820, filed for W. Hess-G. Vella Coleiro June 30, 1975 now U.S. Pat. No.3,972,037. With tuned circuits characterized by finite Qs, if we refresh at $x=0$, the current in the capacitor of one circuit builds up and peaks at a later time. Meanwhile, the current in the capacitor of the other circuit builds up 90° later. The average in-plane field vector is some intermediate value along the +x axis (coincident with the axis of the minor loops). The vector increases and becomes a maximum as it aligns with the $-x$ axis. The holding field is aligned to augment the rotating field vector at its weakest point and to reduce the vector at its peak, thus providing a more nearly circular field.

If we consider the magnitude of the field generated by two tuned circuits arranged to be refreshed during each cycle of operation, the significance of an in-plane dc field during normal operation is perhaps easier to understand. Consider two tuned circuits with a Q of about 10 and a 30 oersted drive field at maximum along say the +x direction. The field typically decays to 0.8 that value or 24 oersteds in the $-x$ direction prior to refresh. It is clear then that a 3 oersted dc field in the $-x$ direction compensates for the difference.

Similarly, a difference occurs in the field intensities generated along the y axis. Consequently, a dc component of $\sqrt{\frac{3}{2}}$ oersteds at a 45° angle to the $-x$ and $-y$ axes is advantageous. For systems in which the two tuned circuits are coupled together as disclosed in the above-mentioned Bobeck application, the preferred orientation for the dc in-plane field may be slightly different. Whatever the angle, it is arranged to coincide with that of the holding field as dictated by stop-start operation.

In bubble drive field supplied by other than tuned circuit means where an offset in the field may not occur, the in-plane field conveniently is aligned to generate strong poles when an elongated domain (bubble) first moves to the line of chevron elements in an expander detector stage 35 of a bubble memory as shown in FIG. 1. The detector stage is defined by a plurality (a column) of chevron elements interconnected to one another to form a magneto-resistance device as is well known and all the interconnections are to one side of the apices of the elements. Moreover, the interconnected sides are shorter than the other sides of the elements and the field is aligned to strengthen poles along the sorter sides. The alignment of the in-plane field to foster stretching of a domain for detection is consistent with the alignment requirements for stop-start operation and for correction of drive field offset.

In one embodiment of this invention a wedge-shaped keeper 1.4 inch by ¾ inch having a slope of 2° was bonded to an INDOX pemanent magnet of equal size. The magnet was about 30 mils thick. The resulting composite structure produced a uniform active field of 160 oersteds over an area 200 mils by 850 mils. The structure also produced an in-plane dc component of 5.6 oersteds. The permanent magnet had a coercivity of 3400 oersteds and a 40 oersted nominal rotating field was used. The can was made of permalloy and was of sufficient thickness to avoid magnetic saturation due to the permanent magnet. The composite structures were made smaller than the can in order to reduce fringing effects which could otherwise cause variations in the field intensity at the edges of those structures.

The amount of holding field required in any particular instance is a function of the demagnetizing field of the propagation elements as is well understood in the art. That is to say, the higher the demagnetizing field of a propagate element the higher the holding field required.

What has been described is considered merely illustrative of the principles of this invention. Therefore, various modifications thereof can be devised by those skilled in the art in accordance with those principles within the spirit of the invention as encompassed by the following claims. For example, the permanent magnet of each composite also can be made wedge-shaped still leading to a wedge-shaped composite structure in accordance with this invention.

What is claimed is:

1. A magnetic bubble memory comprising a layer of material in which magnetic bubbles characterized by a magnetization in a first direction can be moved in the presence of a magnetic bias field antiparallel to that first direction, said memory also comprising bias magnet means for providing said bias field, said bias magnet means comprising first and second permanent magnet elements each having a broad face and being magnetized normal to said face, said bias magnet means also including first and second magnetically soft keeper elements, said first bias magnet and keeper elements and said second bias magnet and keeper elements being arranged to form first and second composite structures respectively, and means for fixing said first and second composite structures in spaced-apart positions with said broad faces in parallel planes, said composite structures being of wedge configuration for directing said bias field at an angle to said broad faces to provide a component field parallel to said broad faces in a plane therebetween, said layer being disposed in said plane.

2. A magnetic bubble memory in accordance with claim 1 wherein each of said composite structures includes a wedge-shaped keeper element.

3. A magnetic memory in accordance with claim 2 also including a magnetically soft can encompassing said composite structures and said layer for providing a flux closure path thereabout.

4. A magnetic memory in accordance with claim 3 wherein said keeper elements are arranged on the side of the respective permanent magnets facing said layer.

5. A magnetic memory in accordance with claim 4 also including a pattern of magnetic elements for moving magnetic bubbles along an axis in said layer in response to a magnetic field reorienting in the plane of said layer, said reorienting field having a minimum field intensity in a second direction in said plane, said keeper elements being adapted to align said component field in said second direction.

6. A magnetic memory in accordance with claim 4 also including a pattern of magnetic elements for moving magnetic bubbles in said layer along an axis to an expansion detector stage in response to a magnetic field reorienting to a second direction in the plane of said layer, said keeper elements being adapted to align said component field in said second direction.

7. A bias magnet structure comprising first and second permanent magnet elements each having a broad face and being magnetized for providing a magnetic field normal to said face, first and second magnetically soft keeper elements juxtaposed with said broad faces for forming first and second composite structures therewith respectively, and high permeability means encompassing said composite structures and fixing said elements in a spaced-apart relationship, said composite structure being of wedge shape, said keeper elements being in facing relationship for modifying the direction of said magnetic field such that a field component parallel to said broad faces is provided.

8. A bias magnet in accordance with claim 7 wherein each of said composite structures includes a wedge-shaped keeper element.

* * * * *